US006212076B1

(12) United States Patent
MacQuarrie et al.

(10) Patent No.: US 6,212,076 B1
(45) Date of Patent: Apr. 3, 2001

(54) ENHANCED HEAT-DISSIPATING PRINTED CIRCUIT BOARD PACKAGE

(75) Inventors: Stephen W. MacQuarrie; Randall J. Stutzman, both of Vestal, NY (US); Jerzy M. Zalesinski, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/259,809

(22) Filed: Feb. 26, 1999

(51) Int. Cl.$^7$ ........................................... H05K 7/20
(52) U.S. Cl. ........................ 361/720; 174/252; 361/749
(58) Field of Search .................................. 174/252, 254; 361/704, 707, 719–721, 749, 794

(56) References Cited

U.S. PATENT DOCUMENTS

| 5,195,021 | 3/1993 | Ozmat et al. .................... 361/386 |
| 5,258,887 | 11/1993 | Fortune ............................. 361/720 |
| 5,297,107 | 3/1994 | Metzger et al. ................... 361/778 |
| 5,412,538 | 5/1995 | Kikinis et al. .................... 361/792 |
| 5,461,201 | 10/1995 | Schonberger et al. ............. 174/16.3 |
| 5,563,773 | 10/1996 | Katsumata ........................ 361/764 |
| 5,621,616 | 4/1997 | Owens et al. .................... 361/704 |
| 5,708,566 | 1/1998 | Hunninghaus et al. ........... 361/764 |
| 5,978,223 | * 11/1999 | Hamilton et al. ................ 361/704 |
| 5,982,630 | * 11/1999 | Bhatia ............................. 361/719 |

FOREIGN PATENT DOCUMENTS 363307768   12/1988   (JP) .

* cited by examiner

Primary Examiner—Gregory Thompson
(74) Attorney, Agent, or Firm—Arthur J. Samodovitz

(57) ABSTRACT

A printed circuit board is provided comprising a substrate, a conductor on the surface of the substrate, and an electronic component mounted on the conductor. The printed circuit board includes a first thermally conductive layer within the substrate and a second thermally conductive layer on a portion of the surface of the substrate and spaced from the electronic component. The electronic component is thermally coupled to the second thermally conductive layer by a thermally conductive aperture positioned within the substrate and connected to the conductor and the first thermally conductive layer. The first thermally conductive layer is connected to the second thermally conductive layer by a plurality of apertures also positioned in the substrate. Another printed circuit board is also provided comprising a first plurality of laminate dielectric layers, a conductor on a surface of the first plurality of laminated dielectric layers, and an electronic component mounted on the conductor. The printed circuit board includes a second plurality of laminated dielectric layers connected to the first plurality of laminated dielectric layers by a flexible web. The flexible web includes a first thermally conductive layer positioned within the first plurality of dielectric layers. A thermally conductive aperture thermally connects the electronic component to the first thermally conductive layer. A plurality of thermally conductive apertures is positioned within the second plurality of dielectric layers and thermally couples the first thermally conductive layer to a second thermally conductive layer which is included on a portion of a surface of the second plurality of dielectric layers and spaced from the electronic component. The flexible web portion thus allows positioning of the second thermally conductive layer in a plane remote from the electronic component when it is positioned in a confined space.

29 Claims, 8 Drawing Sheets

ENHANCED HEAT-DISSIPATING PRINTED CIRCUIT BOARD PACKAGE

FIELD OF THE INVENTION

This invention relates generally to a printed circuit board, and more particularly to an improved printed circuit board design which enhances heat dissipation from electronic components, such as a memory integrated circuit assembly, mounted on the printed circuit board.

BACKGROUND OF THE INVENTION

A memory component comprises a memory integrated circuit (IC) mounted on a chip carrier. The memory component may include a resin package with external leads for mounting the component to an external surface of a multilayer printed circuit board. Other electronic components such as capacitors can also be mounted on the external mounting surfaces. Multilayer printed circuit boards used for these purposes typically include insulating layers, wiring layers between the insulating layers, and wiring layers on the external surface of the multilayer printed circuit board. The external leads of each memory component are typically soldered to pads or other conductors printed on the external surface of the multilayer printed circuit board.

FIG. 1 illustrates a memory module 1 according to the prior art. Memory components 3A, 3B, 3C each comprise an IC mounted on a chip carrier surface and molded in resin material (not shown). The memory components are mounted on an external mounting surface of a multilayer printed circuit board 4. Each memory component has external metal leads 5 soldered to metal pads (not shown) on the external mounting surface 7. A capacitor 2 is also mounted on the external mounting surface. A row of electrical contacts 6 is also shown on the edge of the multilayer printed circuit board to provide electrical contact to other printed circuit boards. U.S. Pat. No. 5,412,538, to Kikinis et al, entitled Space Saving Memory Module, issued on May 2, 1995 depicts a similar memory module as that shown in FIG. 1.

In the memory module 1 described above, heat generation by the ICs increases as the operating speed of the ICs is increased. Total heat generation is also increased by an increased number of ICs, often stacked (in stacked memory modules), needed to increase memory density and performance. Each IC dissipates heat directly into the surrounding air and from the external leads 5 and the metal pads on the external mounting surface to the surrounding air.

The path from the metal pads to the surrounding air is not very effective because there is usually resist or solder mask covering the pads. Furthermore, the external surface of the multilayer printed circuit board is typically comprised of a resin material which has a low heat transfer coefficient. While the direct heat dissipation from the memory component to the surrounding air is more effective than through the printed circuit board, the total heat dissipation is often insufficient to maintain the ICs at the desired temperature especially where the memory components are stacked. Therefore optimal performance cannot be obtained.

Multilayer rigid/flexible printed circuit boards are also known in the field. Typically, a rigid/flexible printed circuit board includes a flexible printed circuit board portion which extends from the periphery of a rigid section or sections with the rigid sections being used for mounting mechanical hardware of electrical components. Circuit boards having these flexible portions offer numerous advantages over standard rigid printed circuit boards. They are easier to handle and can be used where limited space is required since they can be inserted in virtually any shape or space in a system and occupy less space in that system. Also, they offer the advantage of allowing the rigid section of the printed circuit board to be mounted or located in one area, where space is at a premium, allowing the flexible portion to be mounted in a remote area away from the area in which the rigid section is located.

OBJECTS OF THE INVENTION

A primary objective of the present invention is to provide a printed circuit board that significantly enhances heat dissipation from electronic components, such as memory components, mounted on the printed circuit board.

Another object of the present invention is to provide a rigid/flexible printed circuit board having a flexible portion that enhances heat dissipation from electronic components mounted on the rigid section of the printed circuit board.

SUMMARY OF THE INVENTION

In accordance with one aspect of the present invention there is provided a printed circuit board comprising a substrate including a plurality of dielectric layers laminated together, a conductor on a surface of one of the dielectric layers, an electronic component mounted on the conductor, and a first thermally conductive layer between two of the dielectric layers. The printed circuit board further includes a thermally conductive aperture positioned within the substrate, connected to the conductor and thermally coupling the electronic component to the first thermally conductive layer, a second thermally conductive layer on a portion of the surface of the dielectric layer, spaced from the electronic component, and a plurality of thermally conductive apertures positioned within the substrate and thermally coupling the second thermally conductive layer to the first thermally conductive layer whereby the electronic component is thermally coupled to the second thermally conductive layer.

In accordance with another aspect of the present invention there is provided a printed circuit board comprising a first plurality of dielectric layers laminated together, a conductor on a surface of the first plurality of dielectric layers, an electronic component mounted on the conductor, a second plurality of dielectric layers laminated together, and a flexible web located between the first and second plurality of dielectric layers. The flexible web includes a first thermally conductive layer which is also sandwiched between two of the first plurality of dielectric layers and two of the second plurality of dielectric layers. A thermally conductive aperture positioned within the first plurality of dielectric layers, is connected to the conductor, and thermally couples the electronic component to the first thermally conductive layer. A second thermally conductive layer is included on a portion of a surface of the second plurality of dielectric layers and is spaced from the electronic component. A plurality of thermally conductive apertures is positioned within the second plurality of the dielectric layers and thermally couples the second thermally conductive layer to the first thermally conductive layer whereby the electronic component is thermally coupled to the second thermally conductive layer.

BEST MODE FOR CARRYING OUT THE INVENTION

For a better understanding of the present invention together with other and further objects, advantages and capabilities thereof, reference is made to the following disclosure and appended claims in connection with the above referenced drawings.

Figure 1:
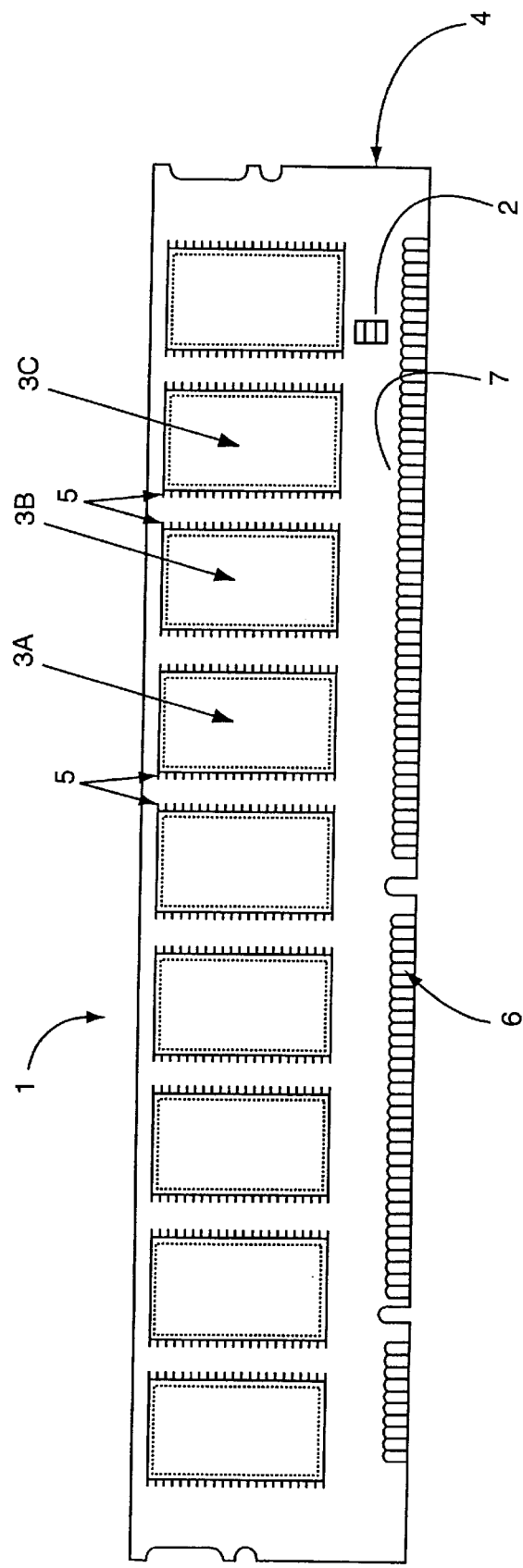
FIG. 1 illustrates a memory module according to the prior art.
Figure 2:
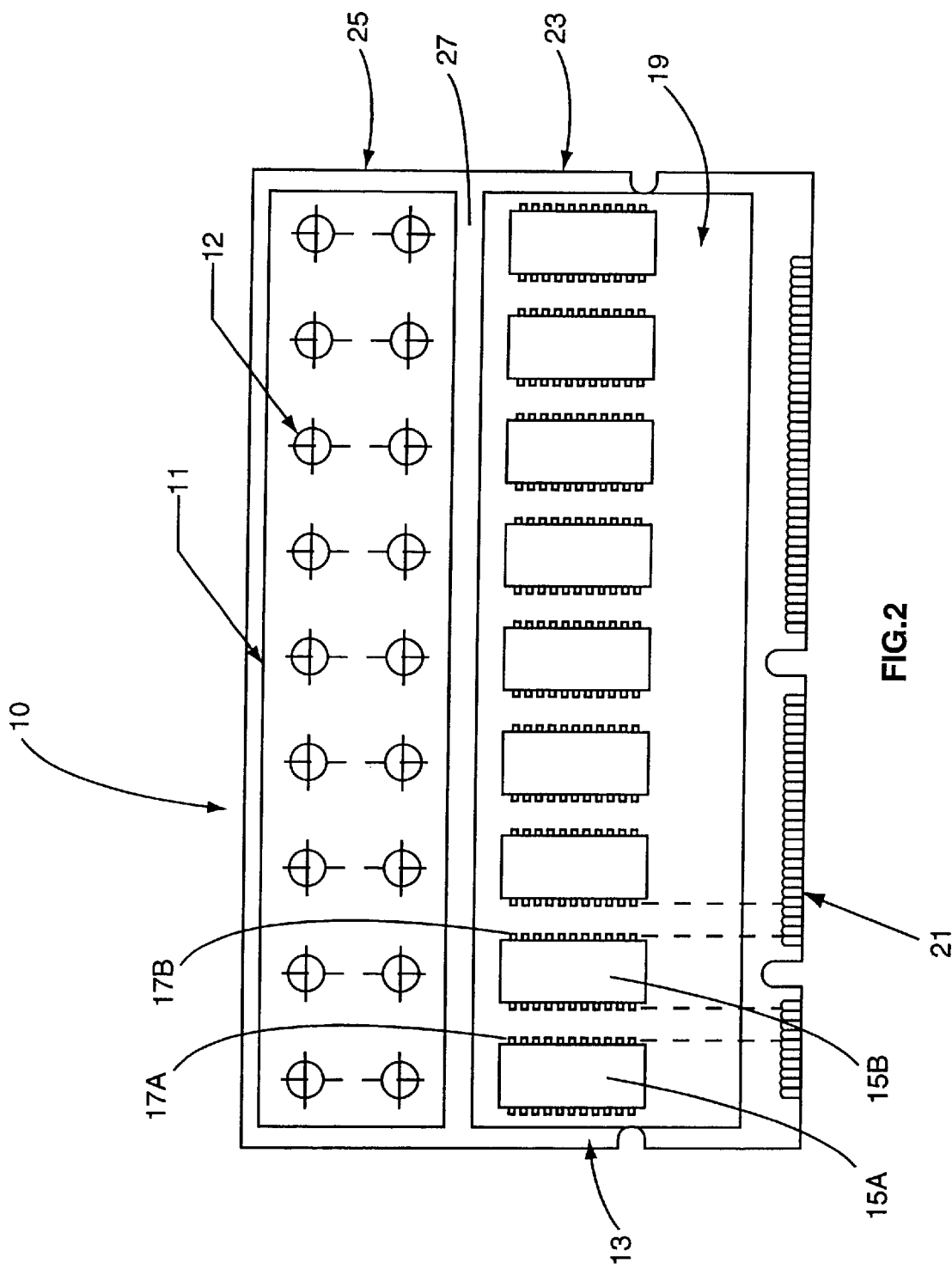
FIG. 2 is a top view of one embodiment of a printed circuit board according to the present invention.
Figure 3:
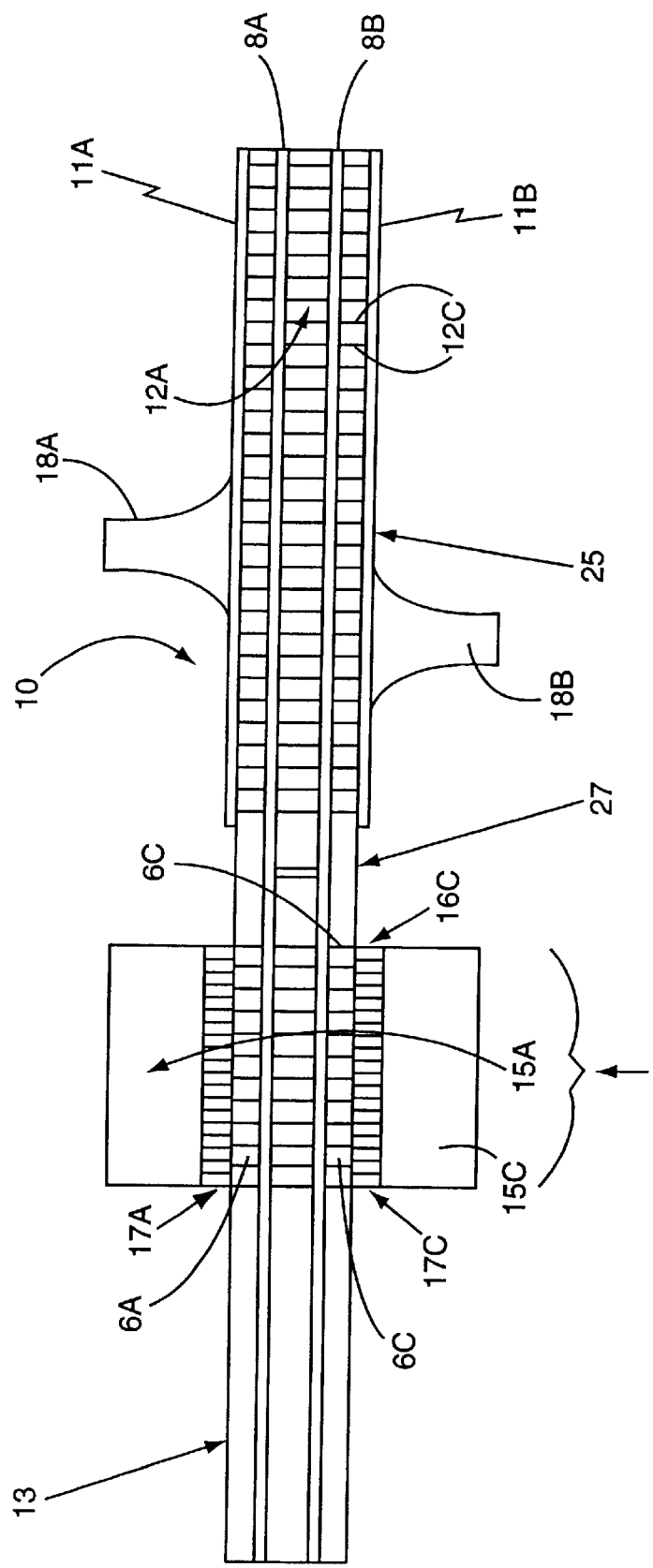
FIG. 3 is a cut away side view of the printed circuit board of FIG. 2 illustrating the relationship of the invention's various internal parts.

Referring to FIGS. 2 and 3, there is shown a populated printed circuit board or module 10 according the present invention. Module 10 includes a printed circuit board 13 populated with electronic components, such as memory components 15A,B, and external circuitization to carry heat and electrical current to other areas of the board. Examples of materials that can be used for dielectric layers within the substrate of the printed circuit board 13 are epoxy glass, epoxy paper, ceramic, polyimide, or laminates including thin film layers of permanent photo resist (i.e. solder mask). The printed circuit board can be either rigid or flexible or a combination thereof. The printed circuit board also includes internal metal layers for electrical power, signal and ground connection and to provide a heat sinking path. FIG. 3 illustrates two such layers 8A, B which simultaneously are used for both electrical and thermal connection to minimize cost. However, if desired, separate conductive layers can be used for electrical and thermal purposes. In the illustrated embodiment there are memory components mounted on both external surfaces of printed circuit board 13. Conductive layers 8A, B can be comprised of copper, molybdenum, gold or copper invar copper composites, preferably copper. The thermally conductive layers can range in thickness from about 1 mil (0.001 inches) to about 5 mils depending on whether the layers are used for an electrical or thermal application and the amount of current to be carried or heat to be dissipated from the memory components 15A,B. The thickness of the printed circuit board can be from about 15 mils to about 350 mils, preferably about 45 mils to about 55 mils.

Memory component 15A includes external leads 17A (FIG. 4) which are connected to contact pads 16A on the substrate. By way of example, the leads are gull wing, J leaded type or compliant pins and are connected to contact pads 16A using solder, a conductive material, such as a conductive adhesive, or a metal bump. Leads 17A and contact pads 16A have a dual purpose. A predetermined number of leads and contact pads function as electrical signal contacts and the remainder of the contacts serve as thermal and ground contacts.

In accordance with the present invention, leads 17A and contact pads 16A on the surface of the printed circuit board serve as a thermal path by being connected to a thermally conductive aperture 6A. Thermally conductive aperture 6A comprises a plated through hole 9A and a conductive material substantially filling the aperture in plated through hole 9A. Preferably the thermally conductive material is a metal or an organic metal matrix. For dual purposes use, as shown, the thermally conductive apertures are also electrically conductive. Copper is the preferred filling metal, but a solder composite including gold, aluminum, or other metals can be used. The apertures can be shaped as tubular holes, vias, trenches, slots or other shapes. Preferably, the plated through hole 9A is a via plated with a metal such as copper, and can have a diameter of from about 2 mils to about 40 mils, preferably from about 10 mils to about 14 mils and a wall thickness of about 0.2 to completely filled preferably 0.4 mils to 1 mil. The depth of the apertures can go part way through the printed circuit board or can go fully through the printed circuit board as required.

Figure 4:
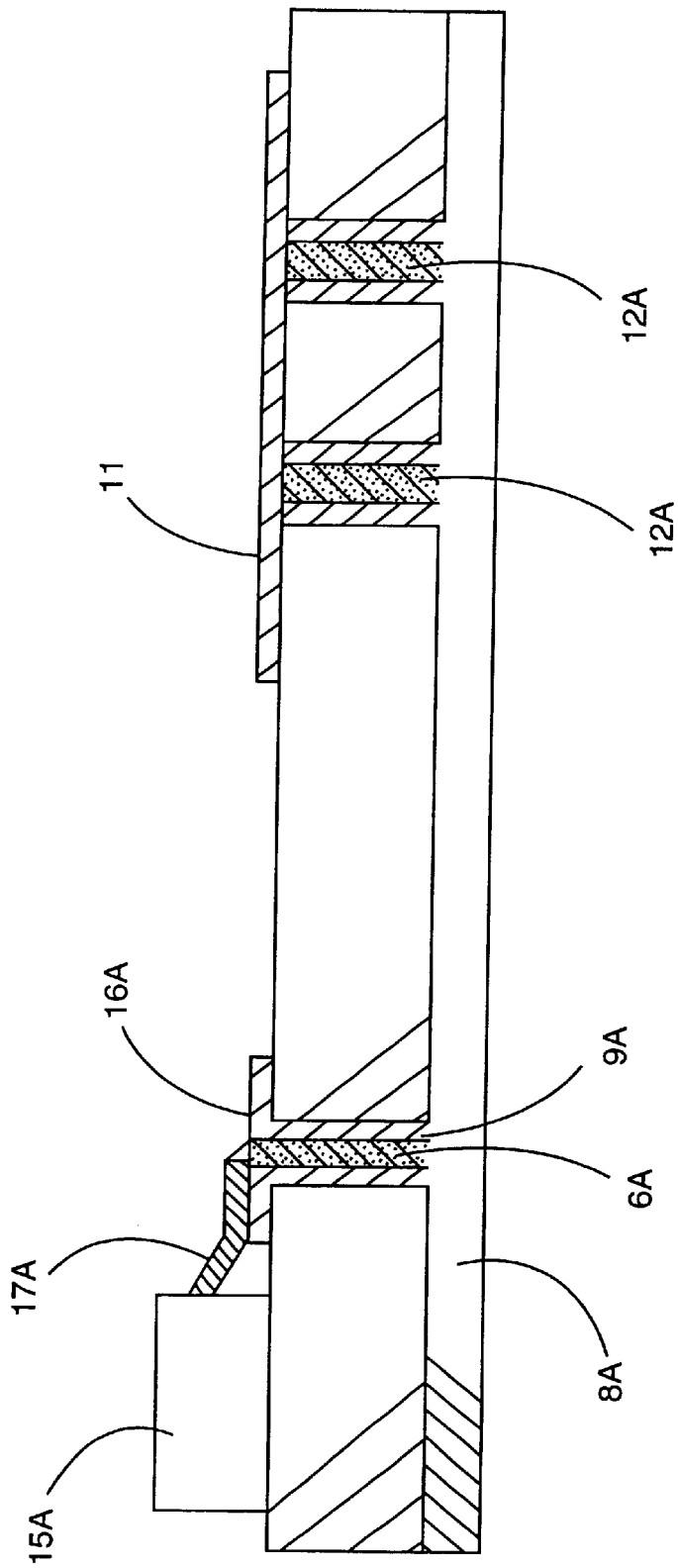
FIG. 4 is a cut away side view of a portion of the printed circuit board of FIG. 3 illustrating more detail of the relationship of the invention's various internal parts.
Figure 6:
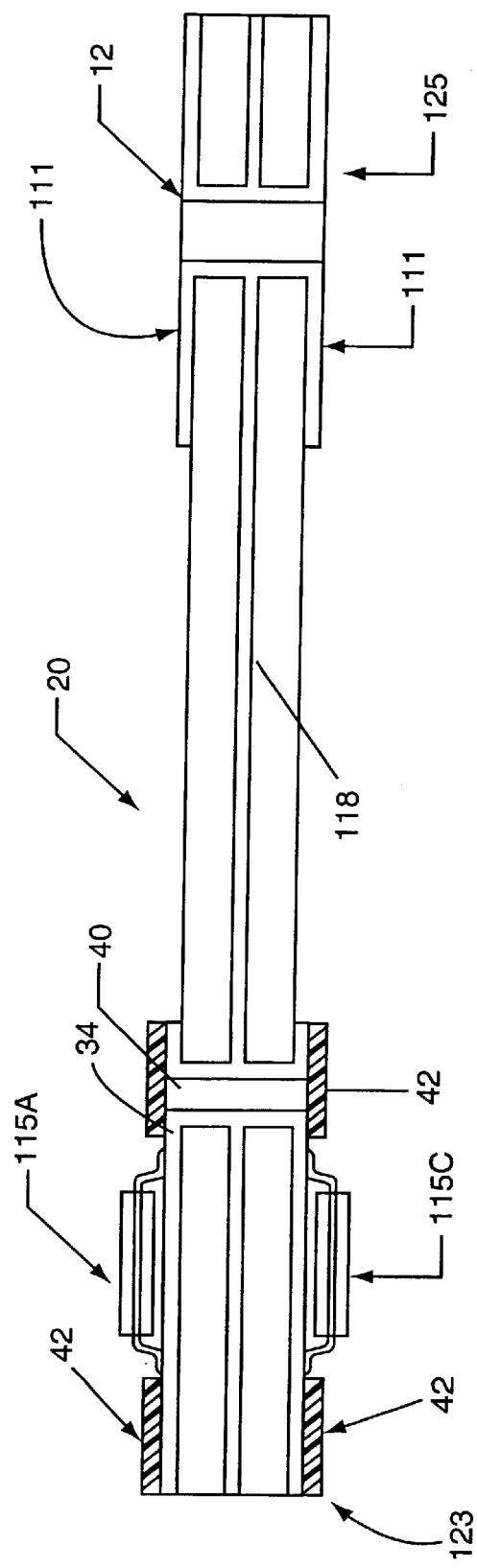
FIG. 6 is a sectional view, in elevation, as taken along the line A—A in FIG. 7 of still another printed circuit according to the present invention.

Preferably, external leads 17A substantially overlie respective filled apertures 6A, as shown in FIGS. 3 and 4, but the filled apertures can also be offset from the memory components as illustrated in FIG. 6. When the apertures are offset from the memory components 15, they are connected to metal conductors 34, printed on the surface of the printed circuit board 13. When external leads 17A overlie apertures 6A, there is a direct conductive path for heat which enhances heat dissipation into thermally conductive layers 8. Thus heat dissipation to the environment not only occurs on the external surface of the memory components 15A and 15B and the printed circuit board 13, but also proceeds from the memory components into and through the printed circuit board by means of the filled apertures 6A and thermally conductive layer 8A.

Printed circuit board 13 also includes another thermally conductive layer 11A (FIG. 3), such as a large metal pad on a portion of the external surface of printed circuit board 13. Thermally conductive layer 11A can be copper, nickel, gold, palladium or combinations thereof. Copper is the preferred metal. Thermally conductive layer 11A can also be formed from a multiplicity of pads coated with nickel, gold, solder, or another type of protectant such as an organic corrosion inhibitor. By way of example, benzatriazole is one organic corrosion inhibitor that can be used in the present invention to protect the pads. Thermally conductive layers 8A,B can be comprised of metal such as copper, molybdenum, gold, and copper invar copper composites, preferably copper. The thermally conductive layers can range in thickness from about 1 mils to about 5 mils depending on whether the layers are used for an electrical or thermal application and the amount of heat to be dissipated from the electronic components 15. Thermally conductive layer 11A is in thermal contact with filled apertures 12A and both serve as a thermal conduit for heat dissipation from memory components 15A,B via thermally conductive apertures 6A and internal conductive layer 8A. Optionally, metal heat sink 18A (or multiple heat sinks) can be bonded or connected by other means such as bolted layer 11A.

Referring to FIG. 2, external or internal metal conductors interconnect externals leads 17A and 17B to connector pads 21. The external conductors are covered with a solder mask layer which protects the electrical conductors during the attachment of solder to the contact pads in preparation for subsequent attachment of memory components 15A and 15B.

FIG. 3 also illustrates a memory component 15C which is attached to the opposite side of printed circuit board 13 as memory component 15A. Component attachment to only one side of the substrate is also possible. In the illustrated embodiment, memory component 15C and its side of printed circuit board 13 is a mirror image of memory component 15A and its side of printed circuit board 13. Thus, memory component 15C has leads 17C connected to contact pads 16C. Leads 17C are connected to thermally conductive apertures 6C. In this example, apertures 6C are connected to thermally conductive layers 8B in order to conduct heat and electricity into the printed circuit board and away from the module 15C. Besides the thermally conductive filing material, the apertures 6C can be plated with a metal such as copper. Thermally conductive layer 8B carries heat through central portion 27 to a second area 25 of the module. It can also carry electricity to other areas for ground purposes. Thermally conductive layer 8B is connected to thermally conductive apertures 12C which are connected to thermally conductive layer 11B. Thermally conductive layer 11B can also function a ground and/or power plane if desired. Thermally conductive apertures 6C comprise a plated through hole and a thermally conductive fill material. Thermally conductive fill material may comprise a metal or an organic metal matrix discussed above. The plated through holes preferable are vias plated with a metal such as copper which can have a diameter from about 2 mils to about 40 mils, preferably from about 15 mils to about 20 mils. The apertures can be shaped as tubular holes, vias, trenches or other shapes necessary to perform the thermal and appropriate electrical functions of the present invention. Thermally conductive layers 11B can be copper, nickel, gold, palladium or combinations thereof. Copper is the preferred metal. Thermally conductive layer 11B can also be formed from a multiplicity of pads coated with nickel, gold, solder, or another type of protectant such as an organic corrosion inhibitor. By way of example, benzatriazole is one organic corrosion inhibitor that can be used in the present invention to protect the pads. Optionally, metal heat sink 18B (or multiple heat sinks) can be bonded to thermally conductive layer 11B with the heat sinks being made of aluminum, steel or other suitable metal. The heat sinks can be attached by known methods in the industry.

Figure 5:
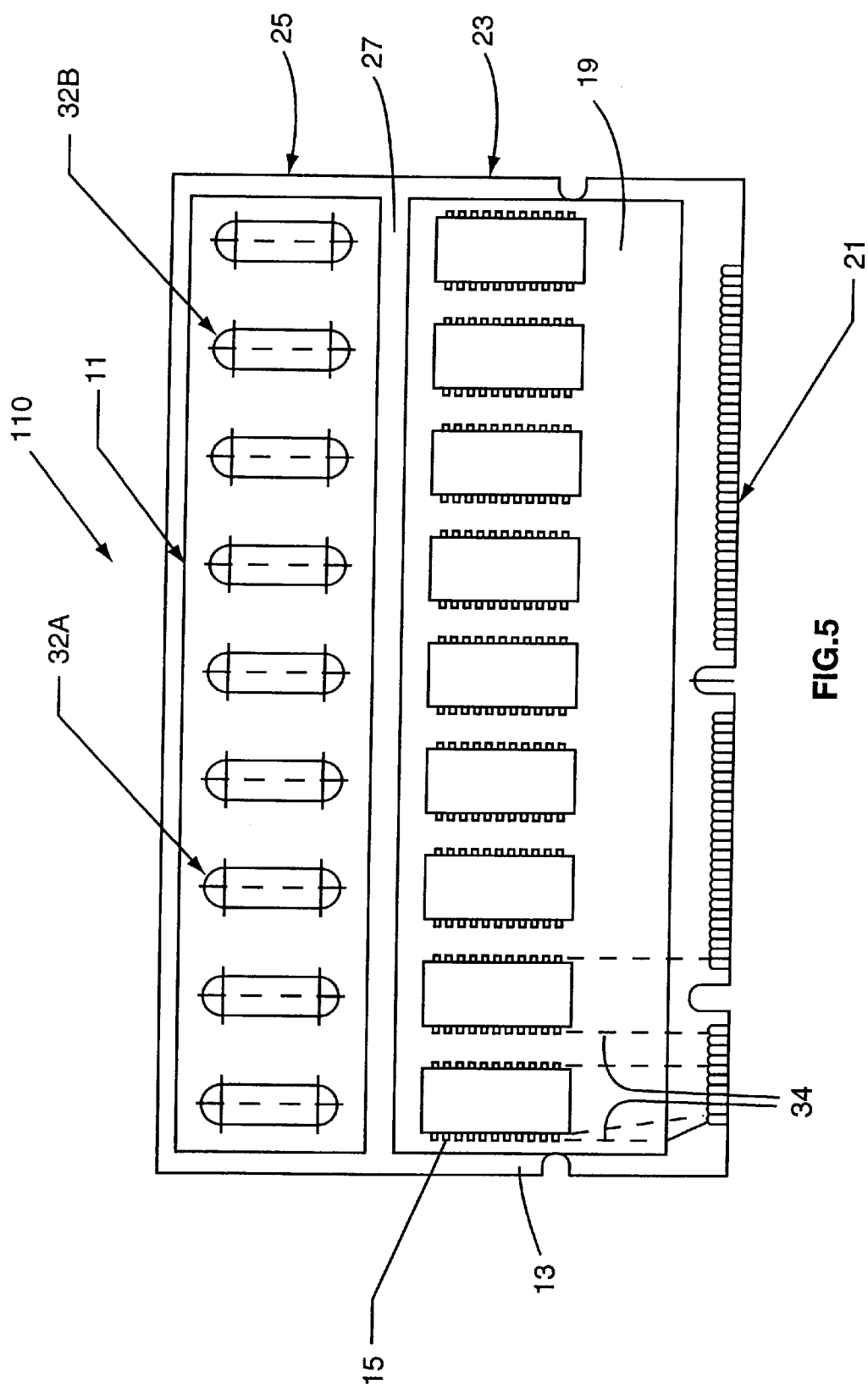
FIG. 5 is a top view of another embodiment of a printed circuit board according to the present invention.

FIG. 5 illustrates another embodiment 110 of the present invention that is identical to module 10 except that module 110 includes trench-shaped conductive apertures 32A, B instead of the cylindrical shaped conductive apertures 12A. When trenches or slots are used there is greater adjustment allowed for heat sink attachment. The trenches or slots 32A,B can have length dimensions of about 0.1 inch to about 1 inch preferably from about 0.25 inches to about 0.5 inches, have a width dimension of about 4 mils to about 200 mils, preferably about 12 mils to about 63 mils, and have a wall thickness of about 0.2 mils to completely filled. The depth of the trenches or slots can go part way through the printed circuit board or can go fully through the printed circuit board, as required.

Figure 7:
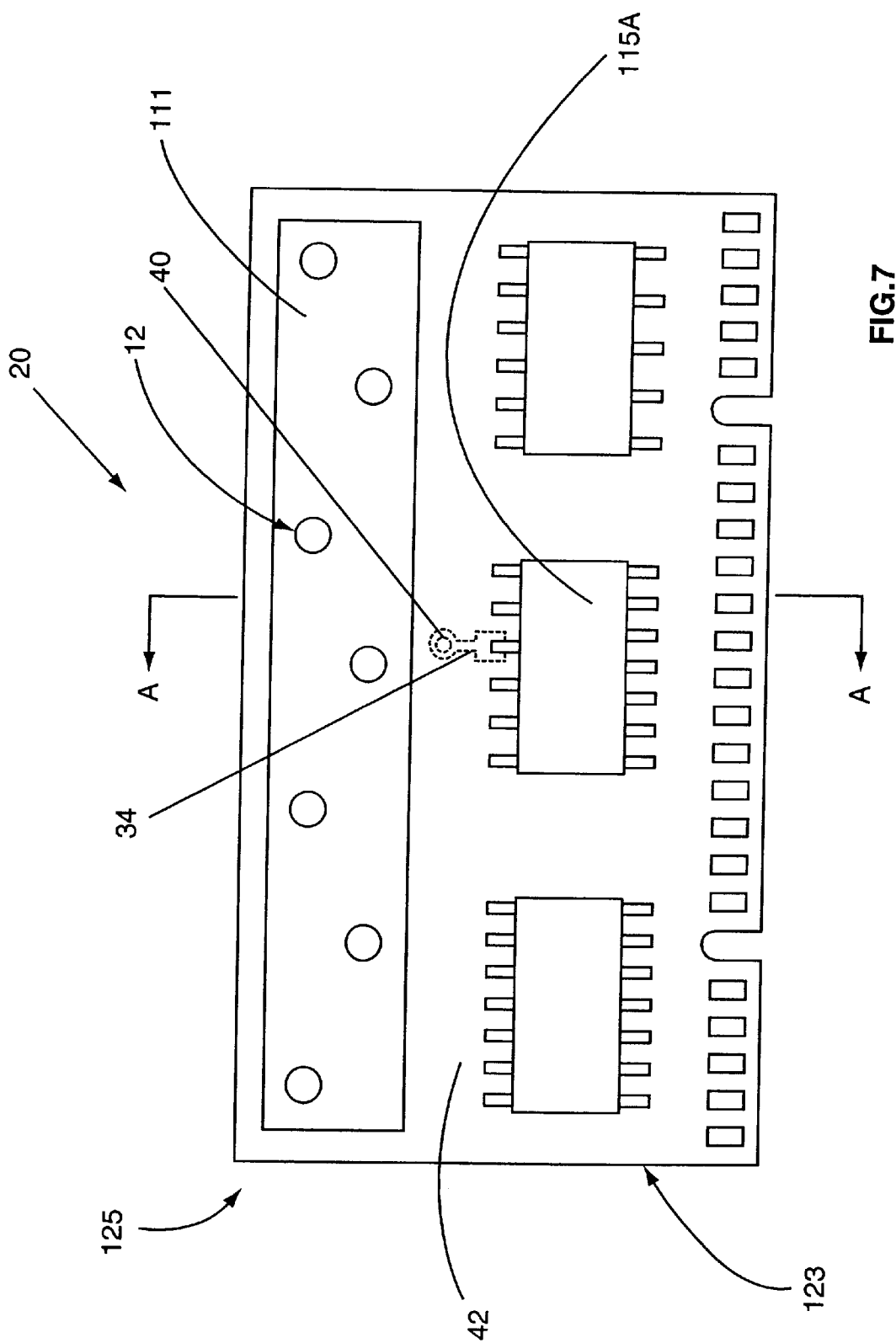
FIG. 7 is a top view of the printed circuit board illustrated in FIG. 6.

FIG. 6 is a cut away side view along A—A (FIG. 7) of a module 20. Module 20 is shown as a top view in FIG. 7 with conductor 34 and conductive filled aperture 40 in phantom. FIG. 6 illustrates another heat dissipating portion in an area 123 wherein electronic components 115A and 115C are offset from conductive filed aperture 40 so as to allow heat dissipated from memory components 115A,C to travel through conductors 34 on the surfaces (usually under solder mask) of the circuit board to aperture 40. The apertures 12 and 40 illustrated in FIG. 6 are similar to those described in FIGS. 3 and 4 above. Heat is dissipated by conduction, which is outside the component area, through thermally conductive layer 118 to another area 125 and to another thermally conductive layer 111. FIG. 6 illustrates conductors 34 covered by a solder mask 42.

Figure 8:
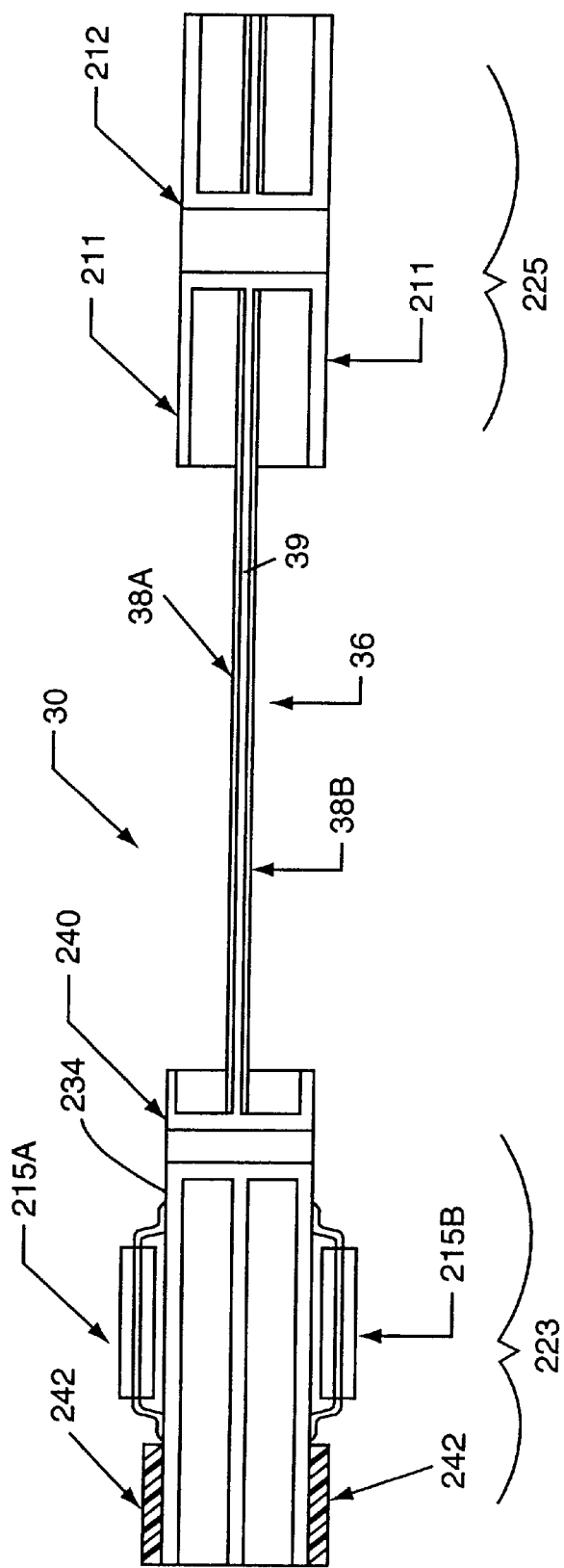
FIG. 8 is a cut away side view of still another printed circuit board according to the present invention.

FIG. 8 is a cut away side view of another module 30 according to the present invention. Portions 223 and 225 of module 30 are similar to respective portions of module 20 except as follows. Items 211, 212, 215A, 215B, 242, 234, and 240 in FIG. 8 correspond to items 11, 12, 115A, 115C, 42, and 34, respectively, in FIG. 6. For example, thermally conductive layer 211 of portion 225 in FIG. 8 corresponds to thermally conductive layer 111 of portion 125 in FIG. 6. Module 30 includes a flexible web portion 36 which connects portion 223 with portion 225. Flexible web portion 36 comprises a polymer layer 39 clad with thermally conductive layers 38A,B forming a metal and polymer composite. Alternatively, polymer layer 39 can be covered with just one thermally conductive layer 38A or B as well. The polymer layer 39 can be comprised of materials such as polyamide, polyimide, and polytetrafluoroethylene or combinations thereof, and have a thickness from about 1 mil to about 10 mils. The conductive layers 38A, B can be comprised of a conductive material such as copper, aluminum, nickel, gold or combinations thereof. Preferably the metal is copper. The thickness of the flexible portions 36 should be from about 3 mils to about 10 mils so as to maintain a substantially flexible characteristic. Thermally conductive layers 38A,B can also serve to conduct electricity to other areas of printed circuit board for ground purposes. The advantage of this flexible portion is that it allows portion 225 to be positioned in a plane different than the plane of portion 223 to take advantage of an external cooling source such as a fan, heat pipe, peltier cooler, or cold plate. Another advantage is that it would allow positioning of a portion of the populated printed circuit board package in a confined space whereby portion 223 can be mounted inside the confined space and portion 225 can be mounted outside the confined space.

The improved heat sinking aspects of present invention allow enhanced heat dissipation of the memory components, thereby component stacking can be accomplished to increase packaging density without loss of function. Memory components are usually stacked in a vertical orientation, one on top of the other, however horizontal stacking is also possible. A combination of vertical and horizontal stacking is also possible. A dual in-line memory module (DIMM) is an example of the use of this invention for multiple memory components. Other types of electronic components that can be used solely or in combination with the memory components, include but are not limited to chip on board mounted integrated circuits, and other integrated circuit packages, such as TO-220s, SOJs, TSOPs, D2PAKs, PQFPs, SOICs, CSPs and PBGAs. These packages are well known in the art and no further description is believed necessary.

While the invention has been particularly shown and described with reference to preferred embodiments thereof, it will be understood by those skilled in the art that various changes in form and details may be made therein without departing from the spirit and scope of the invention.

We claim:

1. A printed circuit board comprising:
   a substrate including a plurality of dielectric layers laminated together;
   a conductor on a surface of one of said dielectric layers;
   an electronic component mounted on said conductor;
   a first thermally conductive layer having a substantially flexible portion between two of said dielectric layers, said substantially flexible portion comprising a metal and polymer composite material;

a thermal conductive aperture positioned within said substrate, connected to said conductor and thermally coupling said electronic component to said first thermally conductive layer;

a second thermally conductive layer on a portion of said surface of said dielectric layer, spaced from said electronic component; and a plurality of thermally conductive apertures positioned within said substrate and thermally coupling said second thermally conductive layer to said first thermally conductive layer whereby said electronic component is thermally coupled to said second thermally conductive layer.

2. The printed circuit board of claim 1 wherein said substrate is a circuitized substrate.

3. The printed circuit board of claim 1 wherein said substrate is comprised of a material selected from the group consisting of epoxy glass, epoxy paper, ceramic, and polyimide.

4. The printed circuit board of claim 1 wherein said electronic component is a chip carrier.

5. The printed circuit board of claim 4 wherein said electronic component includes a memory chip bonded to said chip carrier.

6. The printed circuit board of claim 4 wherein said electronic component comprises a plurality of said chip carriers arranged in a stacked formation.

7. The printed circuit board of claim 4 wherein said electronic component includes an integrated circuit bonded to said chip carrier.

8. The printed circuit board of claim 1 wherein said electronic component is thermally coupled to said thermally conductive aperture by a solder member, a conductive adhesive layer, or a metal bump.

9. The printed circuit board of claim 1 wherein said metal of said first thermally conductive layer is selected from the group consisting of copper, aluminum, nickel, and gold.

10. The printed circuit board of claim 1 wherein said polymer composite material of said first thermally conductive layer is selected from the group consisting of polyamide, polyimide, and polytetrafluoroethylene.

11. The printed circuit board of claim 1 wherein said first thermally conductive layer comprises a metal layer within said substrate.

12. The printed circuit board of claim 11 wherein said metal layer of said first thermally conductive layer is selected from the group consisting of copper, molybdenum, gold, and copper invar copper.

13. The printed circuit board of claim 1 wherein said thermally conductive aperture and each of said plurality of thermally conductive apertures include a thermally conductive fill material therein, said thermally conductive fill material comprises a metal or an organic metal matrix.

14. The printed circuit board of claim 13 wherein said metal is selected from the group consisting of solder, gold, aluminum, and copper.

15. The printed circuit board of claim 1 wherein said thermally conductive aperture and each of said plurality of thermally conductive apertures includes an opening with internal walls, said internal walls having a layer of conductive material thereon.

16. The printed circuit board of claim 15 wherein said thermally conductive aperture and each of said plurality of thermally conductive apertures further includes a thermally conductive fill material therein, said thermally conductive fill material comprises a metal or an organic metal matrix.

17. The printed circuit board of claim 16 wherein said metal is selected from the group consisting of solder, gold, aluminum, and copper.

18. The printed circuit board of claim 1 wherein said second thermally conductive layer comprises a pad.

19. The printed circuit board of claim 18 wherein said pad is a metal.

20. The printed circuit board of claim 19 wherein said metal of said pad is selected from the group consisting of copper, nickel, gold, and palladium.

21. The printed circuit board of claim 19 wherein said metal of said pad includes a protective coating thereon, said protective coating is selected from the group consisting of nickel, gold, solder or an organic corrosion protectant.

22. The printed circuit board of claim 1 wherein said second thermally conductive layer is in thermal contact with said first thermally conductive layer.

23. The printed circuit board of claim 22 wherein said second thermally conductive layer comprises a heat sink.

24. The printed circuit board of claim 1 wherein said electronic component, said thermally conductive aperture, said first thermally conductive layer, said plurality of thermally conductive apertures, and said second thermally conductive layer are in electrical contact and provide an electrical path for an electrical ground or signal.

25. A printed circuit board comprising;

a first plurality of dielectric layers laminated together;

a conductor on a surface of said first plurality of dielectric layers;

an electronic component mounted on said conductor;

a second plurality of dielectric layers laminated together;

a flexible web located between and interconnecting said first and second plurality of dielectric layers, said flexible web comprising a flexible, insulating layer and a first thermally conductive layer bonded to said flexible insulating layer, said flexible web being sandwiched between two of said first plurality of dielectric layers;

a thermally conductive aperture positioned within said first plurality of dielectric layers, connected to said conductor and thermally coupling said electronic component to said first thermally conductive layer;

a second thermally conductive layer on a portion of a surface of said second plurality of dielectric layers, spaced from said electronic component; and a plurality of thermally conductive apertures positioned within said second plurality of said dielectric layers, thermally coupling said second thermally conductive layer to said first thermally conductive layer whereby said electronic component is thermally coupled to said second thermally conductive layer.

26. The circuit board of claim 25 wherein said flexible insulating layer of said flexible web comprises a polymer and said first thermally conductive layer of said flexible web comprises a metal.

27. The circuit board of claim 26 wherein said metal is selected from the group consisting of copper, aluminum, nickel, and gold.

28. The circuit board of claim 26 wherein said polymer layer is a material selected from the group consisting of polyamide, polyimide, and polytetrafluoroethylene.

29. The circuit board of claim 26 wherein said web has a thickness of from about 3 mils to about 10 mils.

* * * * *